(12) United States Patent
Bernstein et al.

(10) Patent No.: US 7,863,734 B2
(45) Date of Patent: Jan. 4, 2011

(54) DUAL-SIDED CHIP ATTACHED MODULES

(75) Inventors: Kerry Bernstein, Underhill, VT (US); Timothy Dalton, Ridgefield, CT (US); Timothy Harrison Daubenspeck, Colchester, VT (US); Jeffrey Peter Gambino, Westford, VT (US); Mark David Jaffe, Shelburne, VT (US); Christopher David Muzzy, Burlington, VT (US); Wolfgang Sauter, Richmond, VT (US); Edmund Sprogis, Underhill, VT (US); Anthony Kendall Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 12/186,655

(22) Filed: Aug. 6, 2008

(65) Prior Publication Data

US 2009/0065925 A1  Mar. 12, 2009

Related U.S. Application Data

(62) Division of application No. 11/383,595, filed on May 16, 2006, now Pat. No. 7,462,509.

(51) Int. Cl.
*H01L 23/34* (2006.01)
*H01L 23/48* (2006.01)

(52) U.S. Cl. .................. 257/723; 257/778; 257/774; 257/E23.169

(58) Field of Classification Search .............. 257/723, 257/778, 774, E23.169
See application file for complete search history.

(56) References Cited

U.S. PATENT DOCUMENTS

| | | | |
|---|---|---|---|
| 4,854,986 A | 8/1989 | Raby | |
| 5,399,896 A * | 3/1995 | Oku | ............................ 257/412 |
| 5,426,072 A | 6/1995 | Finnila | |
| 5,715,144 A * | 2/1998 | Ameen et al. | ................ 361/790 |
| 5,994,166 A | 11/1999 | Akram et al. | |
| 6,157,080 A * | 12/2000 | Tamaki et al. | ................ 257/738 |
| 6,194,290 B1 | 2/2001 | Kub et al. | |
| 6,276,205 B1 | 8/2001 | McNie et al. | |
| 6,670,212 B2 | 12/2003 | McNie et al. | |
| 6,717,251 B2 | 4/2004 | Matsuo et al. | |
| 6,784,023 B2 | 8/2004 | Ball | |
| 6,873,037 B2 | 3/2005 | Kinsman | |
| 7,045,901 B2 * | 5/2006 | Lin et al. | ..................... 257/778 |

(Continued)

OTHER PUBLICATIONS

Notice of Allowance (mail date Jul. 28, 2008) for U.S. Appl. No. 11/383,595, filed May 16, 2006; Confirmation No. 7910.

*Primary Examiner*—Nitin Parekh
(74) *Attorney, Agent, or Firm*—Schmeiser, Olsen & Watts; Richard M. Kotulak

(57) ABSTRACT

An electronic device and method of packaging an electronic device. The device including: a first substrate, a second substrate and an integrated circuit chip having a first side and an opposite second side, a first set of chip pads on the first side and a second set of chip pads on the second side of the integrated circuit chip, chip pads of the first set of chip pads physically and electrically connected to corresponding substrate pads on the first substrate and chip pads of the second set of chip pads physically and electrically connected to substrate pads of the substrate.

21 Claims, 7 Drawing Sheets

U.S. PATENT DOCUMENTS

| | | |
|---|---|---|
| 7,241,641 B2 | 7/2007 | Savastiouk et al. |
| 2002/0086459 A1 | 7/2002 | Nakajima |
| 2004/0071040 A1* | 4/2004 | Funaba et al. ............... 365/232 |
| 2004/0089943 A1 | 5/2004 | Kirigaya et al. |
| 2004/0178499 A1 | 9/2004 | Mistry et al. |
| 2004/0196682 A1* | 10/2004 | Funaba et al. ............... 365/149 |
| 2004/0222508 A1* | 11/2004 | Aoyagi ...................... 257/686 |
| 2004/0251531 A1* | 12/2004 | Yang et al. .................. 257/686 |
| 2006/0163718 A1* | 7/2006 | Kurihara .................... 257/702 |
| 2006/0254809 A1* | 11/2006 | Kledzik et al. .............. 174/255 |
| 2007/0045796 A1 | 3/2007 | Ye et al. |
| 2007/0045807 A1* | 3/2007 | Greenwood et al. ......... 257/690 |
| 2007/0096333 A1* | 5/2007 | Motamedi et al. .......... 257/777 |
| 2007/0241442 A1* | 10/2007 | Ha et al. .................... 257/686 |

* cited by examiner

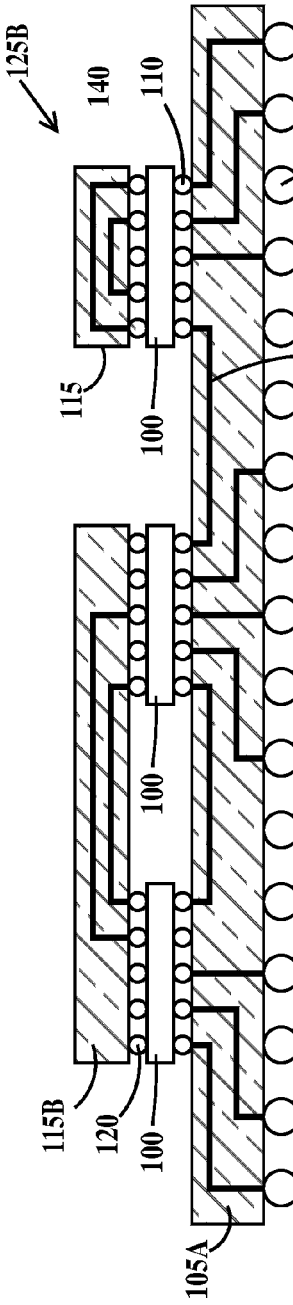
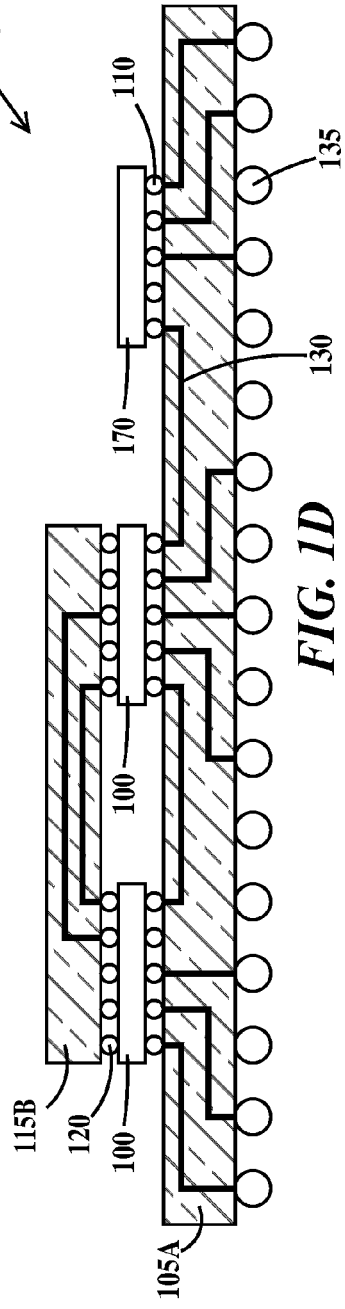
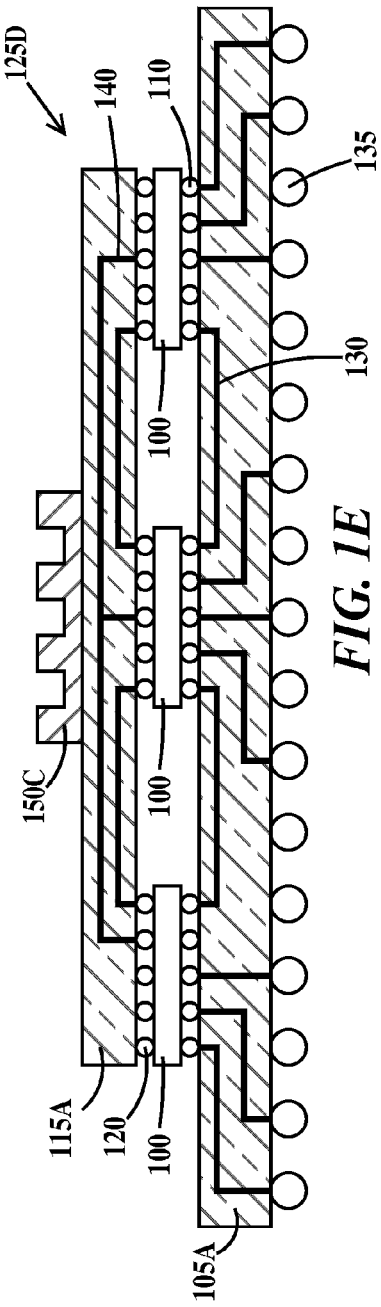

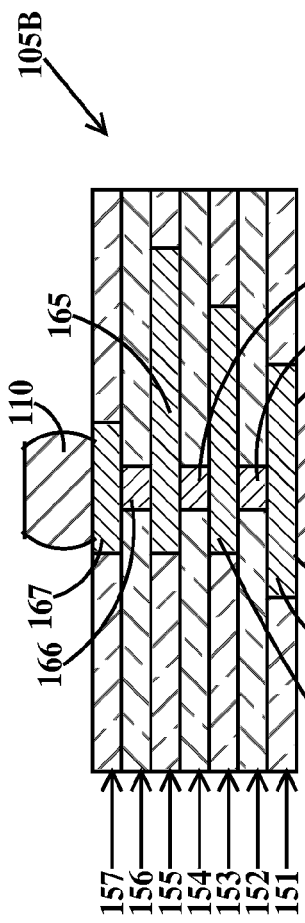
*FIG. 2*
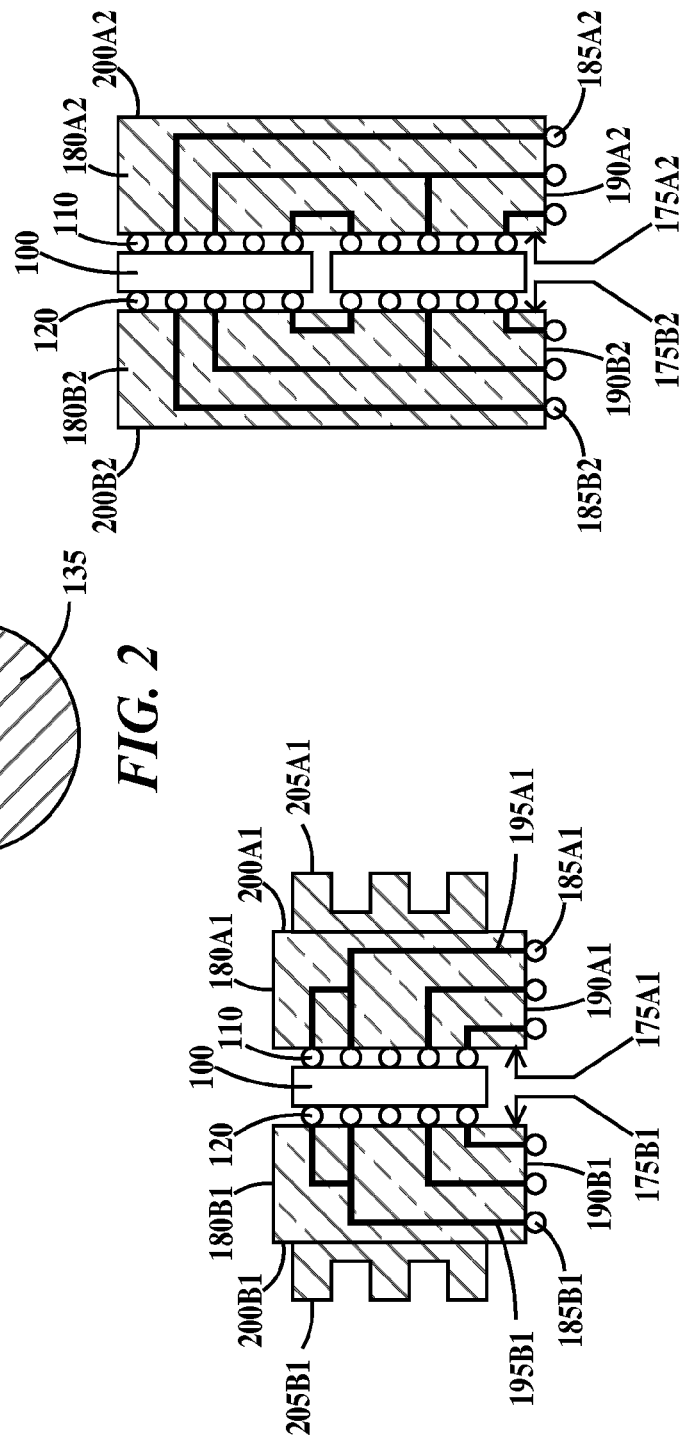
*FIG. 3A*
*FIG. 3B*

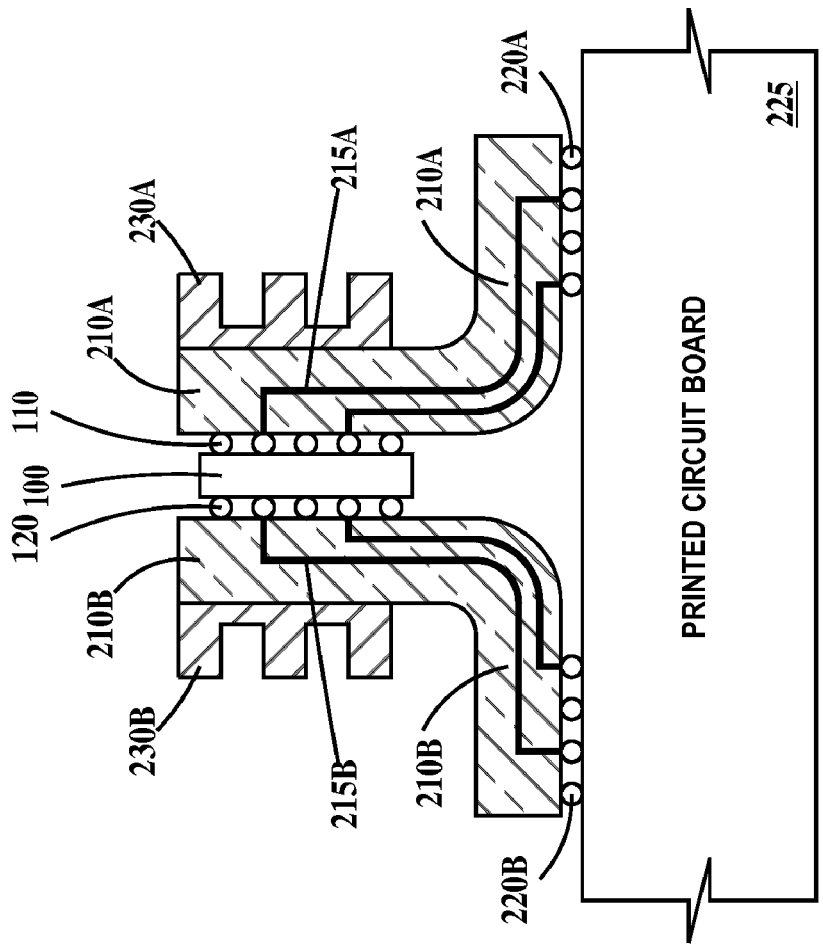
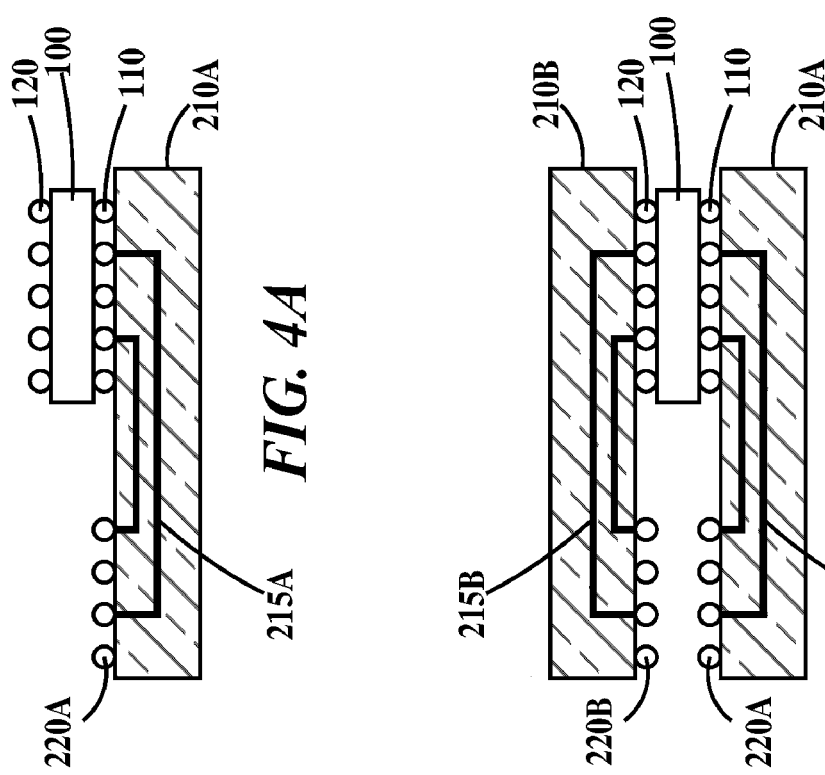
FIG. 4A
FIG. 4B
FIG. 4C

DUAL-SIDED CHIP ATTACHED MODULES

This Application is a division of U.S. patent application Ser. No. 11/383,595 filed on May 15, 2006 now U.S. Pat. No. 7,462,509.

FIELD OF THE INVENTION

The present invention relates to the field of integrated circuits; more specifically, it relates dual-sided chip attached modules.

BACKGROUND OF THE INVENTION

As semiconductor devices such as field effect and bipolar transistors become smaller and more densely packed, it becomes increasingly difficult to provide enough wiring levels to fully utilized the potential that such small devices offer as wiring dimensions do not shrink in scale with device dimensions and there is topographical interference between wiring levels. Therefore, there is a need to provide integrated circuit devices with increased wiring capability.

SUMMARY OF THE INVENTION

A first aspect of the present invention is an electronic device, comprising: a first substrate having a first set of electrically conductive substrate pads on a first surface of the first substrate, a second set of electrically conductive substrate pads on a second surface of the first substrate, and a plurality of electrically conductive wires connecting substrate pads of the first set of substrate pads to corresponding substrate pads of the second set of substrate pads; a second substrate having a third set of electrically conductive substrate pads on a first surface of the second substrate, a plurality of electrically conductive wires in the second substrate interconnecting combinations of substrate pads of the third set of substrate pads; and an integrated circuit chip having a first side and an opposite second side, a first set of chip pads on the first side and a second set of chip pads on the second side of the integrated circuit chip, chip pads of the first set of chip pads physically and electrically connected to corresponding substrate pads of the first set of substrate pads, and chip pads of the second set of chip pads physically and electrically connected to corresponding substrate pads of the third set of substrate pads.

A second aspect of the present invention is the first aspect, further including: a first set of solder bumps physically and electrically connecting the chip pads of the first set of chip pads to the corresponding substrate pads of the first set of substrate pads; and a second set of solder bumps physically and electrically connecting the chip pads of the second set of chip pads to the corresponding substrate pads of the third set of substrate pads.

A third aspect of the present invention is the first aspect, further including: a set of solder bumps physically and electrically connecting the chip pads of the first set of chip pads to the corresponding pads of the first set of substrate pads; and a set of wire bonds physically and electrically connecting the chip pads of the second set of chip pads to the corresponding substrate pads of the third set of substrate pads.

A fourth aspect of the present invention is the first aspect, further including: a heatsink physically attached to a second surface of the second substrate, the second surface of the substrate opposite from the first surface of the second substrate.

A fifth aspect of the present invention is the first aspect, wherein the first surface and the second surface of the first substrate are opposite each other.

A sixth aspect of the present invention is the first aspect, wherein the first surface and the second surface of the first substrate share a common edge and are essentially perpendicular to each other.

A seventh aspect of the present invention is the first aspect, wherein the first substrate is a single or multilevel ceramic substrate, a single or multilevel organic substrate, a fiberglass substrate, a printed circuit board or a tape automated bonding substrate, and wherein the second substrate is a single or multilevel ceramic substrate, a single or multilevel organic substrate, a fiberglass substrate, a printed circuit board or a tape automated bonding substrate.

An eighth aspect of the present invention is the first aspect, further including: an additional integrated circuit chip having a first side and an opposite second side, an additional first set of chip pads on the first side and an additional second set of chip pads on the second side of the additional integrated circuit chip, chip pads of the additional first set of chip pads physically and electrically connected to corresponding substrate pads of the first set of substrate pads, and chip pads of the additional second set of chip pads physically and electrically connected to corresponding substrate pads of the second set of substrate pads A ninth aspect of the present invention is the eighth aspect, wherein, one or more of the wires of the second substrate electrically connect selected chip pads of the second set of chips pads of the integrated circuit chip to selected chip pads of the additional second set of chips pads of the additional integrated circuit chip.

A tenth aspect of the present invention is the first aspect, the integrated circuit chip comprising: one or more devices in a silicon-on-insulator substrate, the silicon-on-insulator substrate comprising a silicon layer on a top surface of an oxide layer and a pre-metal dielectric layer on a top surface of the silicon layer; one or more first wiring levels on a top surface of the pre-metal dielectric layer, each wiring level of the first wiring levels comprising electrically conductive wires in a corresponding dielectric layer; electrically conductive first contacts to the devices, one or more of the first contacts extending from the top surface of the pre-metal dielectric layer to the devices, one or more wires of a lowermost wiring level of the first wiring levels in physical and electrical contact with the first contacts; electrically conductive second contacts to the devices, one or more of the second contacts extending from the bottom surface of the oxide layer to the devices; and one or more second wiring levels over a bottom surface of the oxide layer, each wiring level of the second wiring levels comprising electrically conductive wires in a corresponding dielectric layer, one or more wires of a lowermost wiring level of the second wiring levels in physical and electrical contact with the second contacts.

An eleventh aspect of the present invention is the first aspect, the integrated circuit chip comprising: one or more first devices of a first silicon-on-insulator substrate, the first silicon-on-insulator substrate comprising a first oxide layer, a first silicon layer on the first oxide layer and a first lowermost dielectric layer on the first silicon layer; one or more second devices of a second silicon-on-insulator substrate, the second silicon-on-insulator substrate comprising a second oxide layer, a second silicon layer on the second oxide layer and a second lowermost dielectric layer on the second silicon layer; a top surface of the first oxide layer bonded to a top surface of the second oxide layer; electrically conductive first contacts to the second devices, the first contacts extending from a top surface of the second lowermost dielectric layer through the second lowermost dielectric layer to the first devices; electrically conductive second contacts to the first devices, the second contacts extending from the top surface of the second lowermost dielectric layer through the second lowermost dielectric layer, through the first and second oxide layers to those portions of the second devices formed in the second silicon layer; and one or more second wiring levels over the second lowermost dielectric layer, each wiring level of the second wiring levels comprising electrically conductive wires in a corresponding dielectric layer, one or more wires of a lowermost wiring level of the second wiring levels in physical and electrical contact with the first and second contacts.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 1B, 1C, 1D and 1E are cross-sectional views of multi-chip modules according to a first embodiment of the present invention;

FIG. 2 is a cross-sectional view of the wiring levels of an exemplary module substrate according to the embodiments of the present invention;

FIG. 3A is a cross-sectional view of a single chip module and FIG. 3B is a cross-sectional view of a multi-chip module according to a second embodiment of the present invention;

FIG. 4A is a cross-sectional view of a single chip module and FIGS. 4B and 4C are cross-sectional views of multi-chip modules according to a third embodiment of the present invention;

DETAILED DESCRIPTION OF THE INVENTION

Figure 1A:
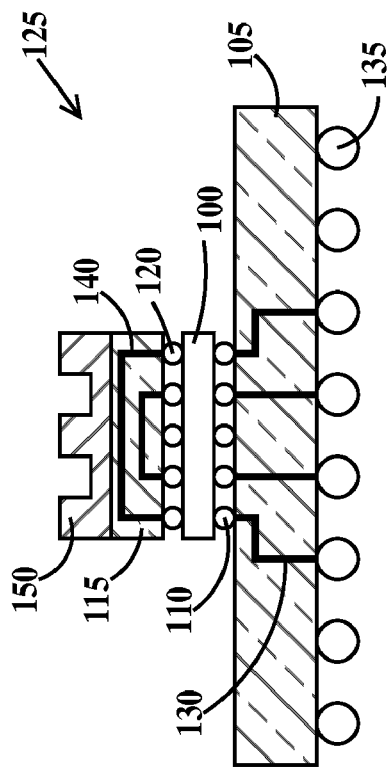
FIG. 1A is a cross-sectional view of a single chip module

FIG. 1A is a cross-sectional view of a single chip module and FIGS. 1B, 1C, 1D and 1E are a cross-sectional views of multi-chip modules according to a first embodiment of the present invention. In FIG. 1A, a dual-sided integrated circuit chip 100 is physically and electrically attached to a substrate 105 by first solder bumps (also called controlled chip collapse connections, C4s) 110 on a first side of integrated circuit chip 100 and physically and electrically attached to a suprastrate 115 by second solder bumps 120 on a second and opposite side of integrated circuit chip 100 to form a single dual-sided chip module 125. First and second solder bumps 110 and 120 are connected to chip pads within integrated circuit chip 100 as described infra. Substrate 105 includes one or more wiring layers containing wires 130 embedded in a dielectric matrix or laminate connecting first solder bumps 110 to solder balls 135 which are located on an opposite side of the substrate from the first solder bumps. Solder balls 135 are used to attach module 125 to the next level of packaging of an electronic device. Suprastrate 115 includes one or more wiring layers containing wires 140 embedded in a dielectric matrix or laminate connecting second solder bumps 120.

Suprastrate 115 thus provides additional integrated circuit wiring capability beyond the wiring layers physical located within integrated circuit chip 100. In one example, suprastrate 115 interconnects inputs and outputs of different circuits within integrated circuit chip 100. In one example, suprastrate 115 provides power distribution to different circuits within integrated circuit chip 100.

Both substrate 105 and suprastrate 115 may comprise single or multiple layers of ceramic or organic based materials with copper or other conductive metal wiring. Examples of organic material includes fiberglass boards (also known as printed circuit boards), flexible circuit carriers and tape automated bonding (TAB) packages. Alternatively, solder balls 135 may be replaced with copper balls, solder columns, pins or lead frames. In one example, solder bumps 110 and 120 and solder balls comprise lead or lead/tin mixtures. Optionally, suprastrate 115 may be provided with a thermal heatsink 150. In one example, heatsink 150 comprises aluminum.

Figure 1B:
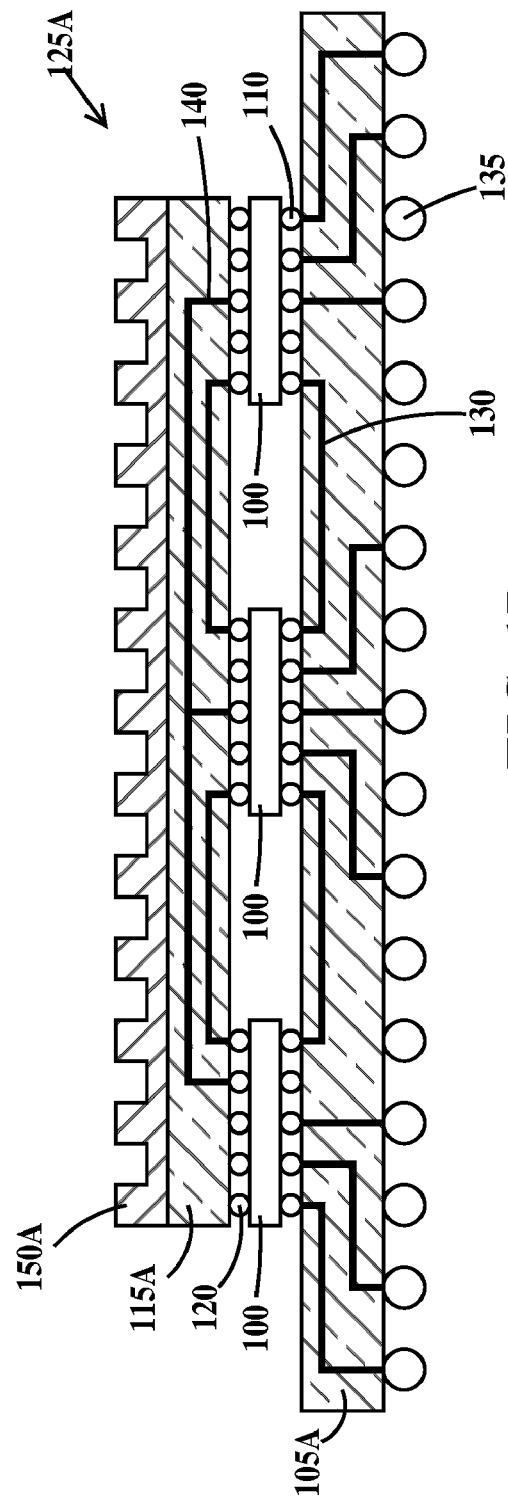

In FIG. 1B, a multi-dual-sided chip module 125A differs from single dual-sided chip module 125 of FIG. 1A in that multiple integrated circuit chips 100 are physically and electrically attached to a substrate 105A and a suprastrate 115A is physically and electrically attached to the integrated circuit chips.

While three integrated circuit chips 100 are illustrated in FIG. 1B, two or more integrated circuits may be attached to substrate 105A. While suprastrate 115A is illustrated in FIG. 1 as attached to all three integrated circuit chips 100, not all of the integrated circuit chips need be attached to the same suprastrate (see FIG. 1C) as there may be more than one suprastrate, each suprastrate attached to different sets of integrated circuit chips. Conventional, single-sided integrated circuit chips may be also be physically and electrically attached to substrate 105A (see FIG. 1D). While optional heatsink 150A is illustrated over all three integrated circuit chips 100, the heatsink may be smaller and placed over selected integrated circuits (see FIG. 1E).

In FIG. 1C, two of integrated circuit chips 100 are physically and electrically attached to a suprastrate 115B and one integrated circuit chip 100 is attached to suprastrate 115. In FIG. 1D, two of integrated circuit chips 100 are physically and electrically attached to a suprastrate 115B and substrate 105A and a single sided integrated circuit chip 170 is also attached to substrate 105A. In FIG. 1E, a heatsink 150C is attached to suprastrate 115A over only one (the middle) integrated circuit chip 100.

FIG. 2 is a cross-sectional view of the wiring levels of an exemplary module substrate according to the embodiments of the present invention. In FIG. 2, substrate 105B comprises multiple dielectric layers 151, 152, 153, 154, 155, 156 and 157 containing respective lower substrate pads 161, vias 162, wires 163, vias 164, wires 165, vias 166 and upper substrate pads 167 providing an electrical connection between first solder bumps 110 and solder balls 135.

FIG. 3A is a cross-sectional view of a single chip module and FIG. 3B is a cross-sectional view of a multi-chip module according to a second embodiment of the present invention. In FIG. 3A, integrated circuit chip 100 is physically and electrically attached to a top surface 175A1 of a first substrate 180A1 by first solder bumps 110. First solder bumps 110 are electrically connected to edge solder bumps 190A1 on an edge 190A1 of first substrate 180A1 by wires 195A1 formed in the first substrate. Edge 190A1 is adjacent to top surface 175A1. Integrated circuit chip 100 is physically and electrically attached to a top surface 175B1 of a second substrate 180B1 by second solder bumps 120. Second solder bumps 120 are electrically connected to edge solder bumps 190B1 on an edge 190B1 of second substrate 180B1 by wires 195B1 formed in the second substrate. Edge 190B1 is adjacent to top surface 175B1. Edges 190A1 and 190B1 are coplanar so that edge solder bumps 190A1 and 190B1 may be attached to a flat surface of a next packaging level, for example, to a printed circuit board.

Attached to bottom surfaces 200A1 and 200B1 are respective optional heatsinks 205A1 and 205B1. Bottom surface 200A1 is opposite top surface 175A1 and bottom surface 200B1 is opposite top surface 175B1.

Both substrates 180A1 and 180B1 may comprise single or multiple layers of ceramic or organic based materials with copper or other conductive metal wiring. Alternatively, edge solder balls 185A1 and 185B1 may be replaced with copper balls, solder columns, pins or lead frames. In one example, heatsinks 205A1 and 205B1 comprise aluminum.

FIG. 3B is similar to FIG. 3A except two integrated circuit chips 100 are attached between first and second substrates 180B1 and 180B2. While only two integrated circuit chips are illustrated in FIG. 3B, the second embodiment of the present invention is not limited to two integrated circuit chips.

FIG. 4A is a cross-sectional view of a single chip module and FIGS. 4B and 4C are cross-sectional views of multi-chip modules according to a third embodiment of the present invention. In FIG. 4A, integrated circuit chip 100 is physically and electrically attached to a top surface of a first flexible circuit carrier 210A by solder bumps 110. Flexible circuit carrier 210A includes wires 215A that electrically connect solder bumps 110 to solder bumps 220A formed on the top surface of flexible circuit carrier 210A.

In FIG. 4B, integrated circuit chip 100 is physically and electrically attached to a top surface of a second flexible circuit carrier 210B by solder bumps 120. Flexible circuit carrier 210B includes wires 215B that electrically connect solder bumps 120 to solder bumps 220B formed on the top surface of second flexible circuit carrier 210B.

In FIG. 4C, first and second flexible circuit carriers are 210A and 210B are bent away from each other so that solder bumps 220A and 220B are coplanar. Solder bumps 220A and 220B are then physically and electrically attached to a printed circuit board 225 or another type of electronic substrate. While only one integrated circuit chip 100 is illustrated in FIG. 3C, the dimensions of flexible circuit carriers 210A and 210B may be increased to accommodate multiple integrated circuit chips. Optional heatsinks 230A and 230B may be attached to first and second flexible circuit carriers 210A and 210B respectfully.

In one example, flexible circuit carriers 210A and 210B comprise polyimide or another flexible polymer and wires 215A and 215B comprise copper, aluminum or gold.

Figure 5A:
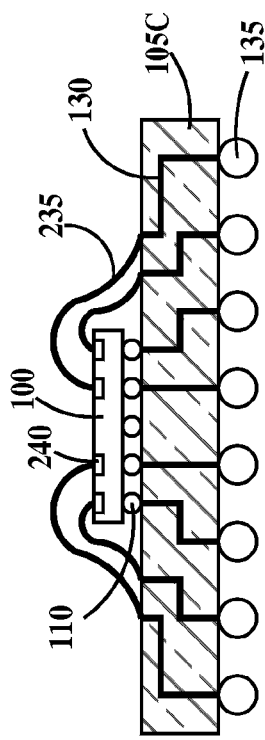
FIG. 5A is a cross-sectional view of a single chip module and FIGS. 5B and 5C are cross-sectional views of multi-chip modules according to a fourth embodiment of the present invention.
Figure 5B:
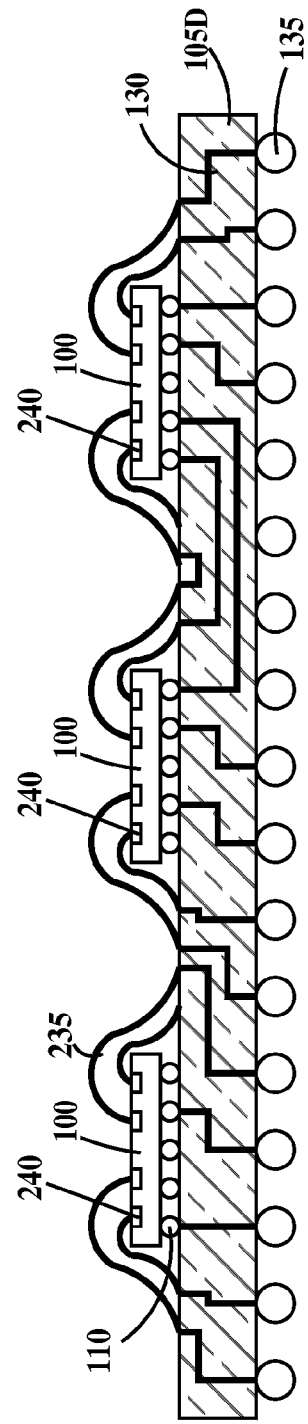
Figure 5C:
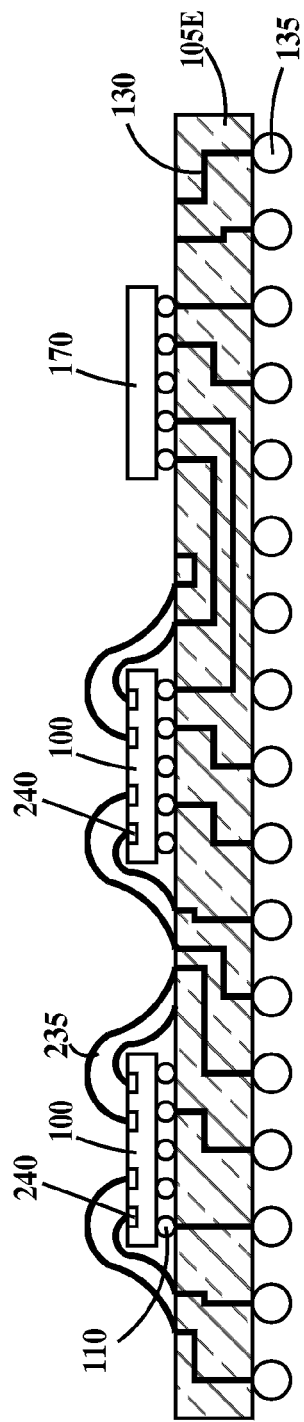

FIG. 5A is a cross-sectional view of a single chip module and FIGS. 5B and 5C are cross-sectional views of multi-chip modules according to a fourth embodiment of the present invention. In FIG. 5A, integrated circuit chip 100 is physically and electrically attached to substrate 105C by solder bumps 110 on a first side of the integrated circuit chip. Integrated circuit chip 100 is also physically and electrically attached to substrate 105 by wire bonds 235 bonded to bonding pads 240 on a second side and opposite side of integrated circuit chip 100. In one example, wire bonds 235 are formed from gold or aluminum wire. FIG. 5B is similar to FIG. 5A except multiple integrated circuits 100 are attached to a substrate 105D. FIG. 5C is similar to FIG. 5B except single sided integrated circuit 170 is also attached to a substrate 105E.

Figure 6:
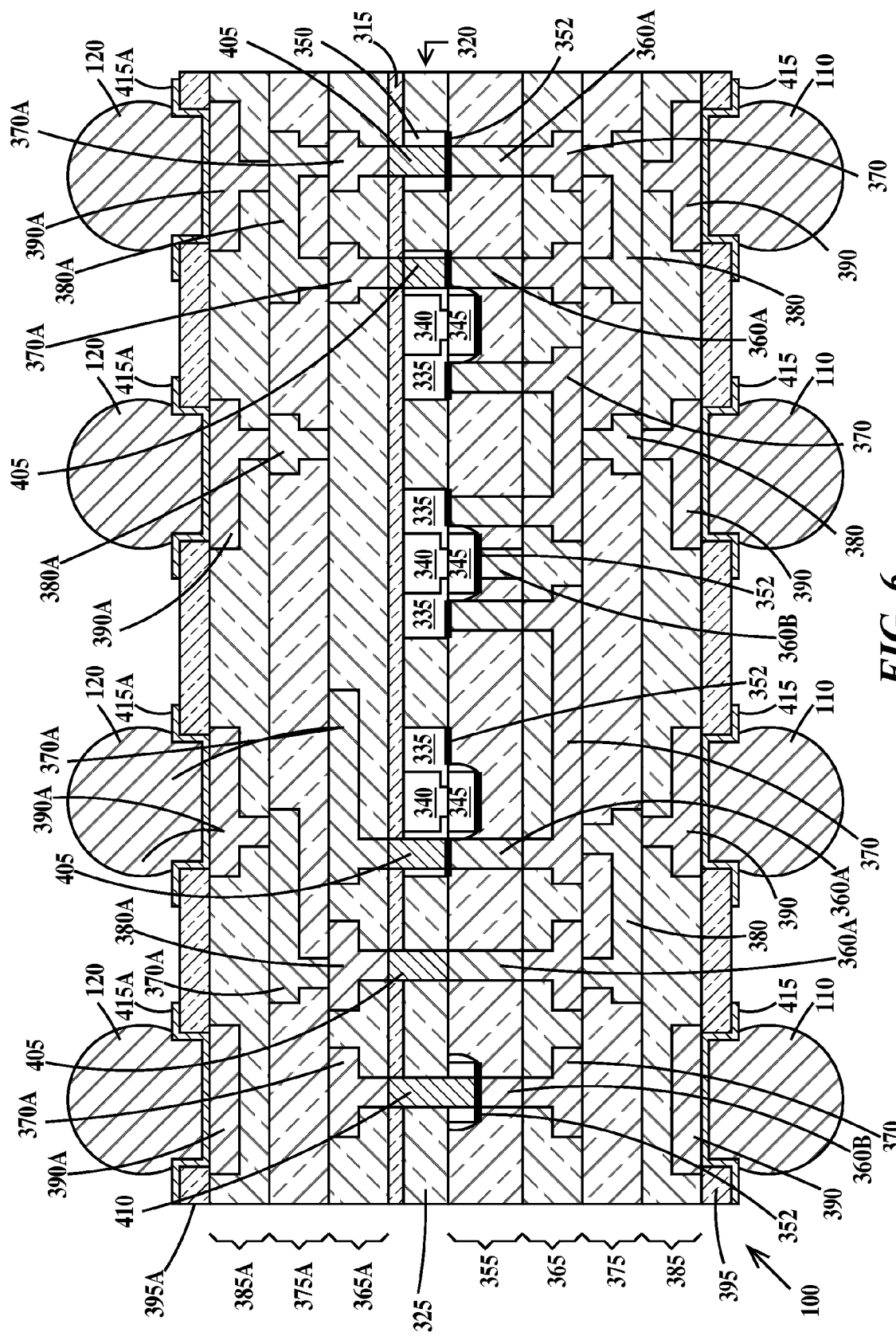
FIG. 6 is a cross-sectional view of an exemplary first type of dual-sided integrated circuit chip suitable for use with any of the embodiments of the present invention.

FIG. 6 is a cross-sectional view of an exemplary first type of dual-sided integrated circuit chip 100 suitable for use with any of the embodiments of the present invention. In FIG. 6, integrated circuit chip 100 includes a buried oxide layer (BOX) 315 formed a single-crystal silicon layer 320. Formed in silicon layer 320 is trench isolation 325 and source/drains 335 and channel regions 340 of field effect transistors (FETs). Also formed in silicon layer 320 are silicon regions 350. Formed over channel regions 340 are a gate dielectric (not shown) and gates 345 of FETs as well as a dummy gate 346. An electrically conductive metal silicide layer 352 is formed on exposed silicon surfaces of source/drains 335, gates 345 and diffusion contacts 350. Formed on top of silicon layer 320 is a pre-metal dielectric (PMD) layer 355. Formed in PMD layer 355 are contacts 360A and 360B. Contacts 360A and 360B are electrically conductive. Contacts 360A electrically contact silicide layer 352 on source/drains 335 and on silicon contact 350. Some of contacts 360A are dummy contacts extending to trench isolation 325. Contacts 360B contact silicide layer 352 on gates 345 and dummy gates 346. PMD layer 355 and contacts 360A and 360B may be considered a wiring level.

Formed on PMD layer 355 is a first inter-level dielectric layer (ILD) 365 including electrically conductive dual-damascene wires 370 in electrical contact with contacts 360A and 360B. Formed on ILD 365 is a second ILD 380 including electrically conductive dual-damascene wires 380 in electrical contact with wires 370. Formed on ILD 375 is a third ILD 385 including electrically conductive dual-damascene I/O and power pads 390 in electrical contact with wires 380.

A dielectric passivation layer 395 is formed on third ILD 385 and I/O and power pads 390. Electrically conductive first type contacts 405 are formed through BOX 315 and silicon layer 320. Contacts 405 extend from the top surface of BOX 315 to silicide layer 352 on source/drains 335 and silicon contact 350. Electrically conductive second type contacts 410 are formed through BOX 315 and trench isolation 325. Contacts 410 extend from the top surface of BOX 315 to silicide layer 352 on dummy gate 346 and to selected contacts 360A. In the case of dummy gate 346, contact 410 extends through the gate dielectric layer (not shown) as well.

Formed on BOX 315 is first inter-level dielectric layer (ILD) 365A including electrically conductive dual-damascene wires 370A in electrical contact with contacts 360A. Formed on ILD 365A is second ILD 380A including electrically conductive dual-damascene wires 380A in electrical contact with wires 370A. Formed on ILD 375A is third ILD 385A including electrically conductive dual-damascene I/O and power pads 390A in electrical contact with wires 380A. A dielectric passivation layer 395A is formed on third ILD 385A and I/O and power pads 390A.

An electrically conductive passivation layer 415 is formed over I/O and power pads 390 through openings in dielectric passivation layer 395 and solder bumps 110 are formed over electrically conductive passivation layer 415. An electrically conductive passivation layer 415A is formed over I/O and power pads 390A through openings in dielectric passivation layer 395A and solder bumps 120 are formed over electrically conductive passivation layer 415A.

Figure 7:
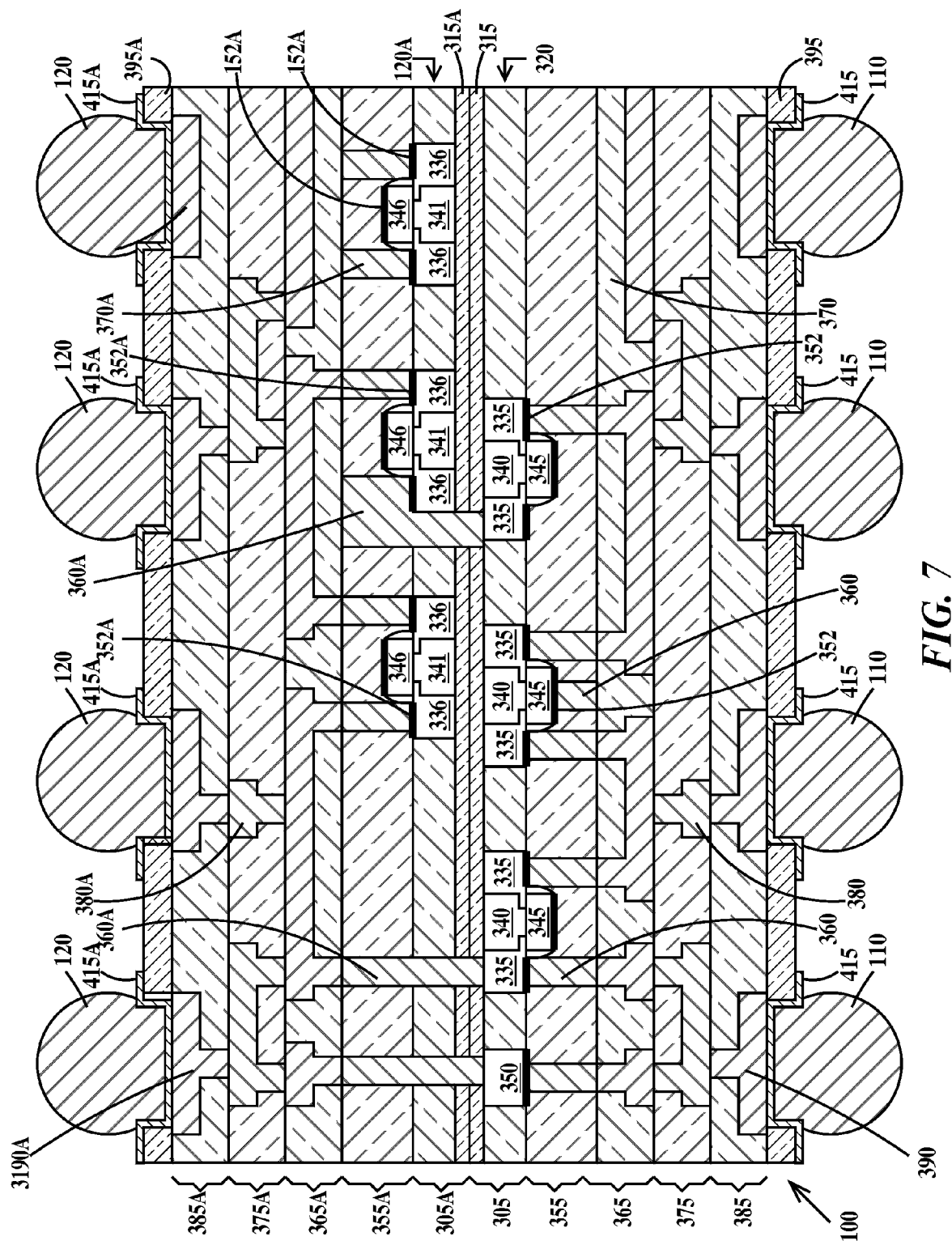
FIG. 7 is a cross-sectional view of an exemplary second type of dual-sided integrated circuit chip suitable for use with any of the embodiments of the present invention.

FIG. 7 is a cross-sectional view of an exemplary second type of dual-sided integrated circuit chip 100 suitable for use with any of the embodiments of the present invention. Integrated circuit chip 100, includes a first buried oxide layer (BOX) 315 formed on the silicon substrate and a first single-crystal silicon layer 320 formed on BOX 315. Formed in silicon layer 320 is a first trench isolation 325 and source/drains 335 and channel regions 340 of field effect transistors.

Also formed in silicon layer 320 are silicon regions 350. Formed over channel regions 340 are a gate dielectric (not shown) and gates 345 of FETs. A metal silicide layer 352 is formed on exposed silicon surfaces of source/drains 335, gates 345 and diffusion contacts 350.

Formed on top of silicon layer 320 is a first PMD layer 355. Formed in PMD layer 355 are contacts 360. Contacts 360 are electrically conductive and electrically contact source/drains 335, gates 345 and silicon contact 350. PMD layer 355 and contacts 360 may be considered a wiring level. Formed on PMD layer 355 is a first inter-level dielectric layer (ILD) 365 including electrically conductive dual-damascene wires 370 in electrical contact with contacts 360. Formed on ILD 365 is a second ILD 380 including electrically conductive dual-damascene wires 380 in electrical contact with wires 370. Formed on ILD 375 is a third ILD 385 including electrically conductive dual-damascene I/O and power pads 390 in electrical contact with wires 380.

Integrated circuit chip 100, also includes a second buried oxide layer (BOX) 315A formed on first BOX layer 315 and a second single-crystal silicon layer 320A formed on BOX layer 315A. Formed in silicon layer 320A is a second trench isolation 325A and source/drains 336 and channel regions 341 of field effect transistors. Formed over channel regions 341 are a gate dielectric (not shown) and gates 346 of FETs. A metal silicide layer 352A is formed on exposed silicon surfaces of source/drains 366 and gates 346.

Formed on top of silicon layer 320A is a second PMD layer 355A. Formed in PMD layer 355A are contacts 360A. Contacts 360A are electrically conductive and electrically contact source/drains 336, gates 346 and silicon contact 350A. PMD layer 355A and contacts 360A may be considered a wiring level. Formed on PMD layer 355A is a fourth ILD 365A including electrically conductive dual-damascene wires 370A in electrical contact with contacts 360A. Formed on ILD 365A is a fifth ILD 380A including electrically conductive dual-damascene wires 380A in electrical contact with wires 370A. Formed on ILD 375A is a sixth ILD 385A including electrically conductive dual-damascene I/O and power pads 390A in electrical contact with wires 380A.

Electrically conductive passivation layer 415 is formed over I/O and power pads 390 through openings in dielectric passivation layer 395 and solder bumps 110 are formed over electrically conductive passivation layer 415. Electrically conductive passivation layer 415A is formed over I/O and power pads 390A through openings in dielectric passivation layer 395A and solder bumps 120 are formed over electrically conductive passivation layer 415A.

Thus the embodiments of the present invention provide integrated circuit devices with increased wiring capability.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention.

For, example, in the various embodiments of the present invention, the dual-sided integrated circuits may be arranged out in a single row or column or may be in a two dimensional array of two or more rows and two or more columns.

Therefore, it is intended that the following claims cover all such modifications and changes as fall within the true spirit and scope of the invention.

What is claimed is:
1. An electronic device, comprising:
a first substrate having a first set of electrically conductive substrate pads on a first surface of said first substrate, a second set of electrically conductive substrate pads on a second and opposite surface of said first substrate, and a plurality of electrically conductive wires connecting substrate pads of said first set of substrate pads to corresponding substrate pads of said second set of substrate pads;
a second substrate having a third set of electrically conductive substrate pads on a first surface of said second substrate, a plurality of electrically conductive wires in said second substrate interconnecting combinations of substrate pads of said third set of substrate pads; and
an integrated circuit chip having a first side and an opposite second side, a first set of chip pads on said first side and a second set of chip pads on said second side of said integrated circuit chip, chip pads of said first set of chip pads physically and electrically connected to corresponding substrate pads of said first set of substrate pads, and chip pads of said second set of chip pads physically and electrically connected to corresponding substrate pads of said third set of substrate pads.
2. The electronic device of claim 1, further including:
a first set of solder bumps physically and electrically connecting said chip pads of said first set of chip pads to said corresponding substrate pads of said first set of substrate pads; and
a second set of solder bumps physically and electrically connecting said chip pads of said second set of chip pads to said corresponding substrate pads of said third set of substrate pads.
3. The electronic device of claim 1, further including:
a set of solder bumps physically and electrically connecting said chip pads of said first set of chip pads to said corresponding pads of said first set of substrate pads; and
a set of wire bonds physically and electrically connecting said chip pads of said second set of chip pads to said corresponding substrate pads of said third set of substrate pads.
4. The electronic device of claim 1, further including:
a heatsink physically attached to a second surface of said second substrate, said second surface of said substrate opposite from said first surface of said second substrate.
5. The electronic device of claim 1, wherein said first surface and said second surface of said first substrate are opposite each other.
6. The electronic device of claim 1, wherein said first surface and said second surface of said first substrate share a common edge and are essentially perpendicular to each other.
7. The electronic device of claim 1, wherein said first substrate is a single or multilevel ceramic substrate, a single or multilevel organic substrate, a fiberglass substrate, a printed circuit board or a tape automated bonding substrate, and wherein said second substrate is a single or multilevel ceramic substrate, a single or multilevel organic substrate, a fiberglass substrate, a printed circuit board or a tape automated bonding substrate.
8. The electronic device of claim 1, further including:
an additional integrated circuit chip having a first side and an opposite second side, an additional first set of chip pads on said first side and an additional second set of chip pads on said second side of said additional integrated circuit chip, chip pads of said additional first set of chip pads physically and electrically connected to corresponding substrate pads of said first set of substrate pads, and chip pads of said additional second set of chip pads physically and electrically connected to corresponding substrate pads of said third set of substrate pads.

9. The electronic device of claim 8, wherein, one or more of said wires of said second substrate electrically connect selected chip pads of said second set of chips pads of said integrated circuit chip to selected chip pads of said additional second set of chips pads of said additional integrated circuit chip.

10. The electronic device of claim 1, said integrated circuit chip comprising:
   one or more devices in a silicon-on-insulator substrate, said silicon-on-insulator substrate comprising a silicon layer on a top surface of an oxide layer and a pre-metal dielectric layer on a top surface of said silicon layer;
   one or more first wiring levels on a top surface of said pre-metal dielectric layer, each wiring level of said first wiring levels comprising electrically conductive wires in a corresponding dielectric layer;
   electrically conductive first contacts to said devices, one or more of said first contacts extending from said top surface of said pre-metal dielectric layer to said devices, one or more wires of a lowermost wiring level of said first wiring levels in physical and electrical contact with said first contacts;
   electrically conductive second contacts to said devices, one or more of said second contacts extending from said bottom surface of said oxide layer to said devices; and
   one or more second wiring levels over a bottom surface of said oxide layer, each wiring level of said second wiring levels comprising electrically conductive wires in a corresponding dielectric layer, one or more wires of a lowermost wiring level of said second wiring levels in physical and electrical contact with said second contacts.

11. The electronic device of claim 1, said integrated circuit chip comprising:
   one or more first devices of a first silicon-on-insulator substrate, said first silicon-on-insulator substrate comprising a first oxide layer, a first silicon layer on said first oxide layer and a first lowermost dielectric layer on said first silicon layer;
   one or more second devices of a second silicon-on-insulator substrate, said second silicon-on-insulator substrate comprising a second oxide layer, a second silicon layer on said second oxide layer and a second lowermost dielectric layer on said second silicon layer;
   a top surface of said first oxide layer bonded to a top surface of said second oxide layer;
   electrically conductive first contacts to said second devices, said first contacts extending from a top surface of said second lowermost dielectric layer through said second lowermost dielectric layer to said first devices;
   electrically conductive second contacts to said first devices, said second contacts extending from said top surface of said second lowermost dielectric layer through said second lowermost dielectric layer, through said first and second oxide layers to those portions of said second devices formed in said second silicon layer; and
   one or more second wiring levels over said second lowermost dielectric layer, each wiring level of said second wiring levels comprising electrically conductive wires in a corresponding dielectric layer, one or more wires of a lowermost wiring level of said second wiring levels in physical and electrical contact with said first and second contacts.

12. The electronic device of claim 11, further including:
   a heatsink physically attached to a second surface of said first substrate, said second surface of said substrate opposite from said first surface of said first substrate.

13. An electronic device, comprising:
   a first substrate having a first set of electrically conductive substrate pads and a second set of electrically conductive substrate pads on a first surface of said first substrate, and a plurality of electrically conductive wires connecting substrate pads of said first set of substrate pads to corresponding substrate pads of said second set of substrate pads;
   a second substrate having a third set of electrically conductive substrate pads and a plurality of electrically conductive fourth substrate pads on a first surface of said second substrate, and a plurality of electrically conductive wires connecting substrate pads of said third set of substrate pads to corresponding substrate pads of said fourth set of substrate pads; and
   an integrated circuit chip having a first side and an opposite second side, a first set of chip pads on said first side and a second set of chip pads on said second side of said integrated circuit chip, chip pads of said first set of chip pads physically and electrically connected to corresponding substrate pads of said first set of substrate pads, and chip pads of said second set of chip pads physically and electrically connected to corresponding substrate pads of said third set of substrate pads.

14. The electronic device of claim 13, further including:
   a first set of solder bumps physically and electrically connecting said chip pads of said first set of chip pads to said corresponding substrate pads of said first set of substrate pads; and
   a second set of solder bumps physically and electrically connecting said chip pads of said second set of chip pads to said corresponding substrate pads of said third set of substrate pads.

15. The electronic device of claim 12, further including:
   an additional heatsink physically attached to a second surface of said second substrate, said second surface of said substrate opposite from said first surface of said second substrate.

16. The electronic device of claim 13, wherein said first and second substrates are flexible circuit carriers.

17. The electronic device of claim 13, further including:
   an additional integrated circuit chip having a first side and an opposite second side, an additional first set of chip pads on said first side and an additional second set of chip pads on said second side of said additional integrated circuit chip, chip pads of said additional first set of chip pads physically and electrically connected to corresponding substrate pads of said first set of substrate pads, and chip pads of said additional second set of chip pads physically and electrically connected to corresponding substrate pads of said third set of substrate pads.

18. The electronic device of claim 17, wherein, one or more of said wires of said first substrate electrically connect selected chip pads of said first set of chips pads of said integrated circuit chip to selected chip pads of said additional first set of chips pads of said additional integrated circuit chip.

19. The electronic device of claim 18, wherein, one or more of said wires of said second substrate electrically connect selected chip pads of said second set of chips pads of said integrated circuit chip to selected chip pads of said additional second set of chips pads of said additional integrated circuit chip.

20. The electronic device of claim 13, said integrated circuit chip comprising:
- one or more devices in a silicon-on-insulator substrate, said silicon-on-insulator substrate comprising a silicon layer on a top surface of an oxide layer and a pre-metal dielectric layer on a top surface of said silicon layer;
- one or more first wiring levels on a top surface of said pre-metal dielectric layer, each wiring level of said first wiring levels comprising electrically conductive wires in a corresponding dielectric layer;
- electrically conductive first contacts to said devices, one or more of said first contacts extending from said top surface of said pre-metal dielectric layer to said devices, one or more wires of a lowermost wiring level of said first wiring levels in physical and electrical contact with said first contacts;
- electrically conductive second contacts to said devices, one or more of said second contacts extending from said bottom surface of said oxide layer to said devices; and
- one or more second wiring levels over a bottom surface of said oxide layer, each wiring level of said second wiring levels comprising electrically conductive wires in a corresponding dielectric layer, one or more wires of a lowermost wiring level of said second wiring levels in physical and electrical contact with said second contacts.

21. The electronic device of claim 13, said integrated circuit chip comprising:
- one or more first devices of a first silicon-on-insulator substrate, said first silicon-on-insulator substrate comprising a first oxide layer, a first silicon layer on said first oxide layer and a first lowermost dielectric layer on said first silicon layer;
- one or more second devices of a second silicon-on-insulator substrate, said second silicon-on-insulator substrate comprising a second oxide layer, a second silicon layer on said second oxide layer and a second lowermost dielectric layer on said second silicon layer;
- a top surface of said first oxide layer bonded to a top surface of said second oxide layer;
- electrically conductive first contacts to said second devices, said first contacts extending from a top surface of said second lowermost dielectric layer through said second lowermost dielectric layer to said first devices;
- electrically conductive second contacts to said first devices, said second contacts extending from said top surface of said second lowermost dielectric layer through said second lowermost dielectric layer, through said first and second oxide layers to those portions of said second devices formed in said second silicon layer; and
- one or more second wiring levels over said second lowermost dielectric layer, each wiring level of said second wiring levels comprising electrically conductive wires in a corresponding dielectric layer, one or more wires of a lowermost wiring level of said second wiring levels in physical and electrical contact with said first and second contacts.

* * * * *